United States Patent [19]
Kikuchi et al.

[11] Patent Number: 5,305,242
[45] Date of Patent: Apr. 19, 1994

[54] AC POWER SUPPLY APPARATUS AND LOAD CURRENT MEASUREMENT METHOD IN AC POWER SUPPLY APPARATUS

[75] Inventors: Noriyoshi Kikuchi, Kawasaki; Masayuki Suetomi, Yokohama, both of Japan

[73] Assignee: Kikusui Electronics Corporation, Kanagawa, Japan

[21] Appl. No.: 67,920

[22] Filed: May 27, 1993

[30] Foreign Application Priority Data
  May 29, 1992 [JP] Japan .................................. 4-139186
  Mar. 26, 1993 [JP] Japan .................................. 5-068191

[51] Int. Cl.$^5$ ............................................... G06J 1/00
[52] U.S. Cl. ................................................. 364/602

[58] Field of Search ............... 364/602, 827, 481, 483, 364/487

[56] References Cited
U.S. PATENT DOCUMENTS
5,122,800  6/1992  Philipp ........................... 364/484 X Primary Examiner—Tan V. Mai
Attorney, Agent, or Firm—Finnegan, Henderson, Farabow, Garrett & Dunner

[57] ABSTRACT

An AC power supply apparatus for obtaining sampled data required for the FFT (Fast Fourier Transformation) by an A/D converter. Since a clock pulse train for forming an output voltage (power supply output) is used as sample clock pulses, sampled data associated with exactly one period can be obtained. This eliminates the need for the window processing. This makes it possible to provide a low cost, error-free apparatus.

8 Claims, 14 Drawing Sheets

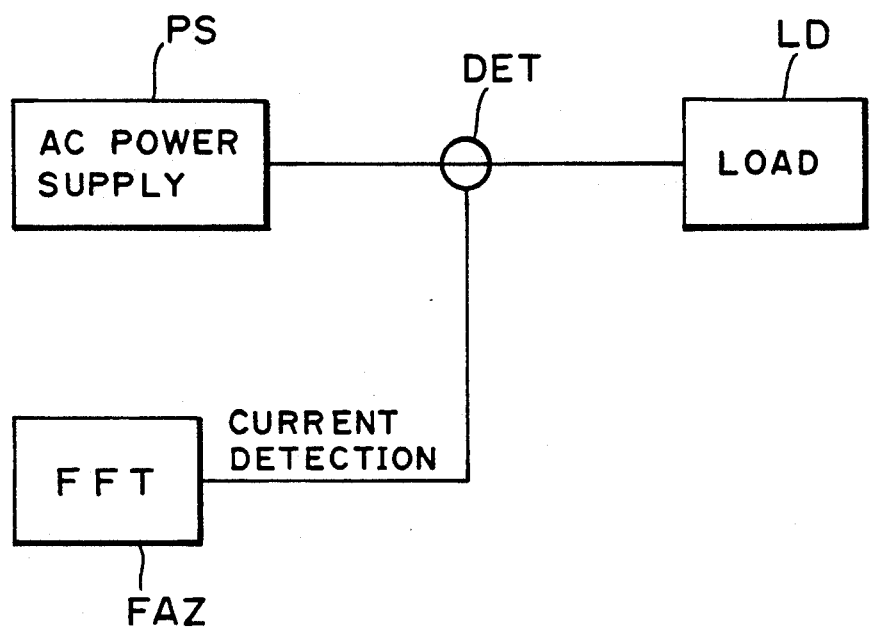
FIG. 1
(PRIOR ART)
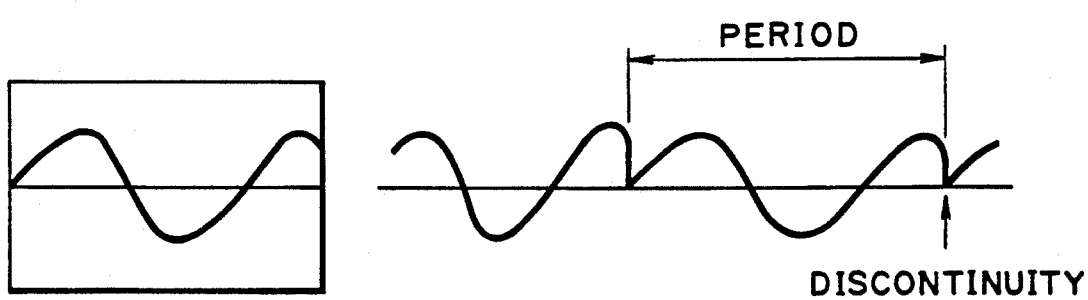
FIG. 2A
(PRIOR ART)
FIG. 2B
(PRIOR ART)

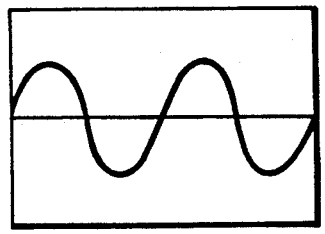
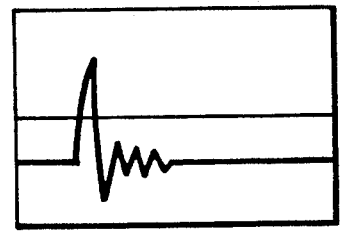
FIG.3A
(PRIOR ART)
FIG.3B
(PRIOR ART)
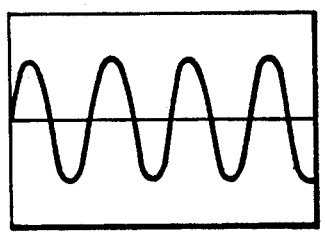
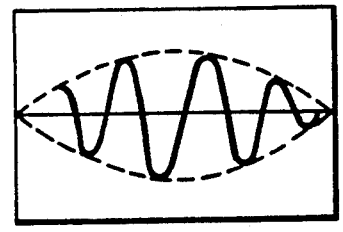
FIG.4A
(PRIOR ART)
FIG.4B
(PRIOR ART)

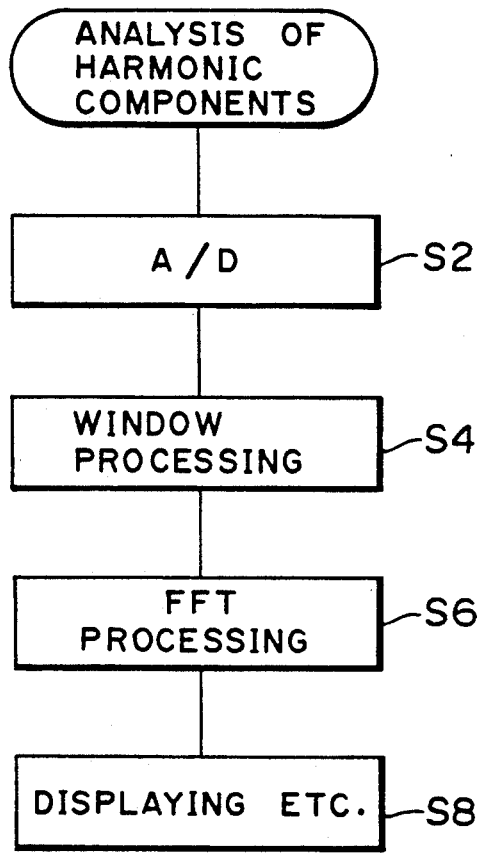
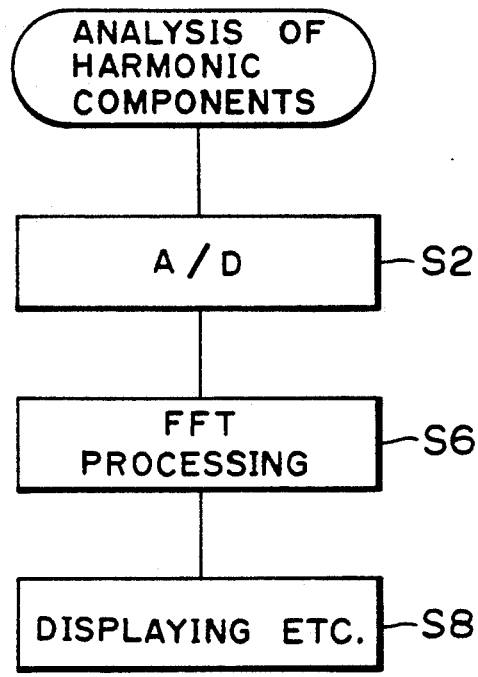
FIG. 13A
(PRIOR ART)
FIG. 13B

AC POWER SUPPLY APPARATUS AND LOAD CURRENT MEASUREMENT METHOD IN AC POWER SUPPLY APPARATUS

BACKGROUND OF THE INVENTION

1. Field of the Invention

The present invention relates to an AC power supply apparatus for supplying a load with an AC power and Fourier transforming a load current to monitor a spectrum and the like, and to a load current measurement method in an AC power supply apparatus.

2. Description of the Prior Art

Recently, with the diversification of load types connected to an AC power supply apparatus, it has been increasingly required to measure harmonic components contained in a load current.

Heretofore, to achieve such measurement, as shown in FIG. 1, a current value detected by a current detection circuit DET is inputted to an FFT (fast Fourier transformation) analyzer FAZ.

Since the prior art FFT analyzer shown in FIG. 1 is provided separately from an AC power supply PS, it has a so-called window processing is required.

The necessity for the window processing will be described with reference to FIGS. 2-4.

As well known, in analyzing an input signal by the FFT analyzer, the input signal is regarded as a periodical signal having a certain frame time so as to determine its Fourier series. The frame time is a value determined by the design of the analyzer, and is not varied with the input signal. For example, when a sinusoidal input signal shown in FIG. (A) is obtained in the frame time, a problem arises in that a Fourier series of a repeated signal as shown in FIG. 2B is determined.

Therefore, a discontinuous point is generated at a point for connecting the beginning and the end of the frame time, and a spectrum including a leakage (a spectrum number of harmonics) in addition to the proper sinusoidal wave spectrum is determined. However, in an exceptional case, when, as shown in FIG. 3A, the period of the sinusoidal wave exactly fits in one frame (the frame time is an integer multiple of the input signal period), or when, as shown in FIG. 3B, the beginning and the end of the signal are considered to converge to a same value, such discontinuous points are not generated and the exact spectrum can be determined.

Then, as a measure for such a problem, it is generally performed that an original signal is multiplied by a function called a window for reducing the leakage to transform the shape of the original input signal into the shape of the signal whose beginning and end converge at zero, thereby eliminating the generation of discontinuity. For example, when the original input signal is as shown in FIG. 4A, the signal multiplied by the window function is as shown in FIG. 4B (see, also FIG. 14A). The FFT analyzer determines a spectrum according to the window processed signal.

As described above, heretofore, in analyzing harmonic components contained in an AC load current, an appropriate window processing has been required to obtain an exact measurement value.

SUMMARY OF THE INVENTION

Therefore, the primary object of the present invention is to provide an AC power supply apparatus which eliminates the need for the window processing in association with the FFT and has an indicator unit for informing the result of the FFT, and a load current measurement method in an AC power supply apparatus.

In a first aspect of the present invention, there is provided an AC power supply apparatus comprising:

clock generator means for generating a clock pulse train;

a first address counter receiving the clock pulse train for generating read addresses;

a waveform memory previously stored with amplitude data of one period of a predetermined voltage waveform;

a D/A converter for converting the memory data which is read from the waveform memory to an analog signal in response to the read addresses outputted from the first address counter;

a power amplifier for amplifying the output of the D/A converter to supply a load with an AC voltage;

current detection means for converting the current flowing through the load to an analog voltage;

an A/D converter for outputting current data by sampling the output of the current detection means using the clock pulse train or a signal associated with the clock pulse train as sample clock pulses;

a second address counter for converting the clock pulse train or the signal associated with the clock pulse train to write addresses;

a sampled data memory for storing the current data in response to the write addresses;

FFT processing means for performing the Fourier transformation on the current flowing through the load using data stored in the sampled data memory; and display means for displaying the output of the FFT processing means.

Here, the frequency $F_{CLK}$ of the clock pulse train may be always set at N times the frequency $f_L$ of the AC voltage applied to the load ($f_{CLK}=N.f_L$), where N is a predetermined positive integer greater than two.

The A/D converter continuously may sample one period of the analog voltage outputted from the current detection means to obtain K sampled data, where K is a predetermined positive integer.

The A/D converter may sample a predetermined number of current data in each one of a plurality of successively periods of the analog voltage outputted from the current detection means, while successively shifting sampling points in each of the periods by a predetermined phase shift increment to obtain K current data, where K is a predetermined positive integer.

The number of the current data may be varied according to the frequency of the AC voltage applied to the load.

The A/D converter may sample one current data in each one of a plurality of successive periods of the analog voltage outputted from the current detection means, while successively shifts a sampling point in each of the periods by a predetermined phase shift increment to obtain K current data, where K is a predetermined positive integer.

The signal generated associated with the clock pulse train may be the output signal of the first or second address counter.

In a second aspect of the present invention, there is provided a load current measurement method in an AC power supply apparatus including clock generator means for generating a clock pulse train, an address counter receiving the clock pulse train for generating a read addresses, a waveform memory previously stored with amplitude data of one period of a predetermined voltage waveform, a D/A converter for converting the memory data which is read from the waveform memory to an analog signal in response to the read addresses outputted from the address counter, and a power amplifier for amplifying the output of the D/A converter to supply a load with an AC voltage, the method comprising the steps of:

converting the current flowing through the load to an analog voltage;

outputting current data by sampling the analog voltage using the clock pulse train or a signal associated with the clock pulse train as sample clock pulses;

storing the current data according to the clock pulse train or the signal associated with the clock pulse train;

performing the Fourier transformation on the current flowing through the load using to the current data; and displaying the result of the Fourier transformation.

According to the present invention, the data in one period can always be precisely sampled, because a clock for forming an output voltage (power supply output) is used as a sampling clock while the sampled data for the FFT are being obtained. The need for the window processing can be eliminated, and errors caused by the window processing can be removed. This is an advantage in view of the cost.

The above and other objects, effects, features and advantages of the present invention will become more apparent from the following description of embodiments thereof taken in conjunction with the accompanying drawings.

BRIEF DESCRIPTION OF THE DRAWINGS

FIG. 1 is a block diagram showing the arrangement of an FFT analyzer and an AC power supply in prior art;

FIG. 2A is a diagram illustrating a waveform in the frame time of the FFT analyzer in FIG. 1;

FIG. 2B is a diagram illustrating a waveform obtained by a window processing of the FFT analyzer in FIG. 1;

FIGS. 3A and 3B are diagrams illustrating waveforms for explaining a window processing of the FFT analyzer in FIG. 1;

FIG. 4A is a diagram illustrating a waveform in the frame time of the FFT analyzer in FIG. 1;

FIG. 4B is a diagram illustrating a waveform obtained after a window processing by the FFT analyzer in FIG. 1;

FIG. 13A is a flow chart showing the operation procedure of the prior art;

FIG. 13B is a flow chart showing the operation procedure of the first and second embodiments.

DETAILED DESCRIPTION OF PREFERRED EMBODIMENTS

Preferred embodiments of the present invention will now be described in detail.

EMBODIMENT 1

Figure 5:
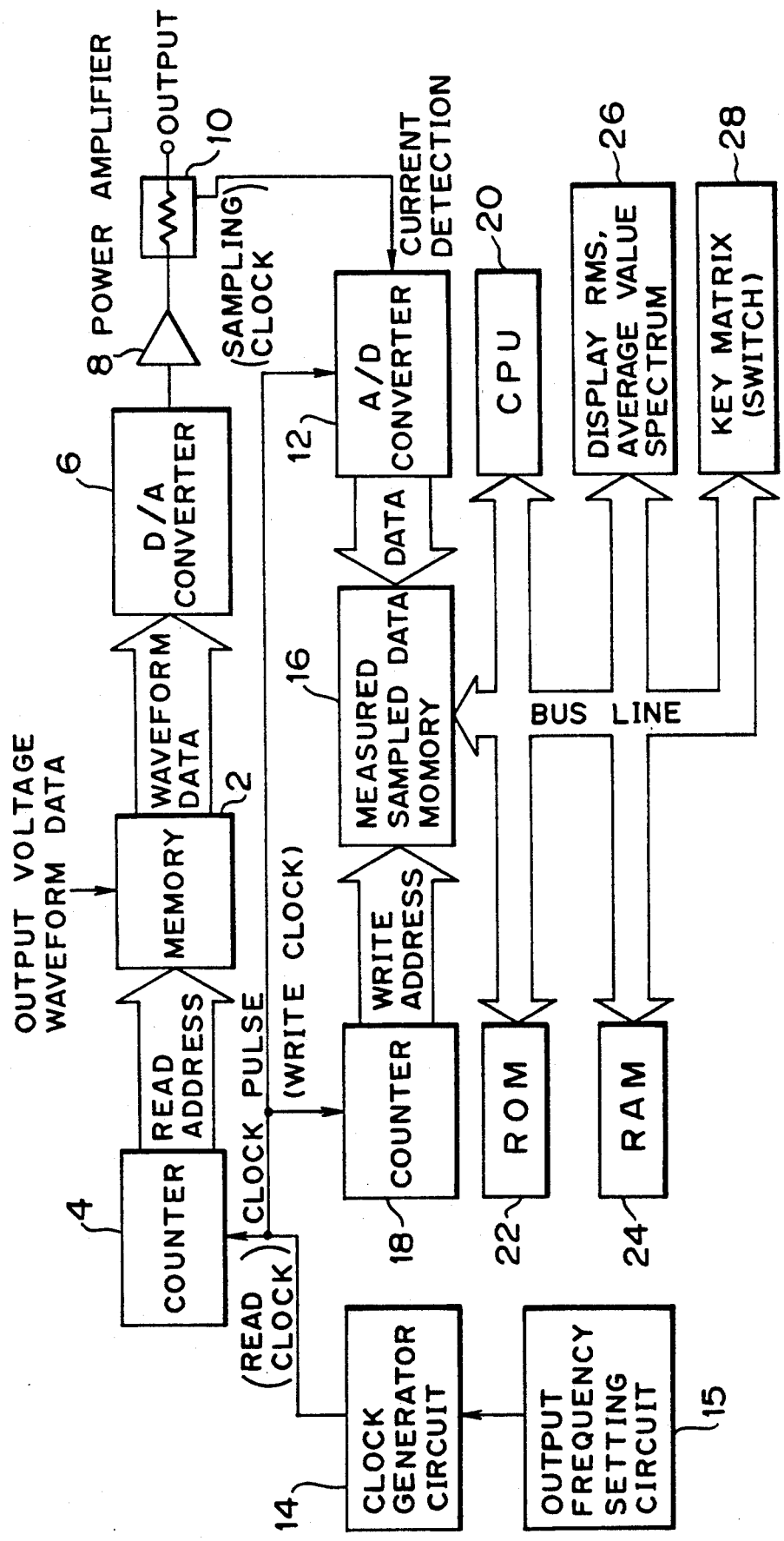
FIG. 5 is a block diagram showing a first embodiment of an AC power supply apparatus in accordance with the present invention.

FIG. 5 shows an AC power supply apparatus with an FFT display to which the present invention is applied. In this Figure, the numeral 2 indicates a waveform memory, which is previously stored with amplitude values of one period of an output voltage waveform (sinusoidal wave, triangular wave, and the like) as digital data. The memory data can also be inputted to the memory 2 by using a program.

The numeral 4 indicates a counter for forming addresses of the waveform memory 2. The numeral 6 indicates a D/A converter for converting digital data (that is, signal waveform data of one period) read from the waveform memory 2 to an analog signal.

The numeral 8 indicates a power amplifier for supplying an AC power required by a load.

The numeral 10 is a current detection circuit for detecting an instantaneous value of a load current. The resistor in this figure merely indicates a concept of current detection, and its circuit structure can be flexibly selected.

The numeral 12 is an A/D converter, which samples the load current every predetermined sampling period and converts the load current to digital data. The sampling clock used for this sampling is supplied by a clock generator circuit 14 which will be described below.

The numeral 14 is the clock generator circuit for outputting a clock pulse train which will be described later. Each pulses of the clock pulse train increments the count value of the counter 4 by one at a time, and is supplied to the A/D converter 12 as a sampling clock. Therefore, the generation timing of a read address formed by the counter 4 and the sampling timing by the A/D converter 12 always synchronize with one another.

The numeral 15 indicates an output frequency setting circuit, which varies the frequency of the clock pulse train for setting the frequency of AC voltage applied to the load to a desired value.

The numeral 16 is a data memory, which stores measured sampled data (that is, output of the A/D converter 12).

The numeral 18 is a counter, which forms write addresses of the measured sampled data memory 16 synchronizing with the clock pulse train outputted from the clock generator circuit 14.

The numeral 20 is a CPU for the FFT, the numeral 22 is a ROM storing a control program and the like, the numeral 24 is a RAM, and the numeral 26 is a display for visualizing RMS values, average values, spectrum distribution, and the like calculated by the CPU 20. The numeral 28 indicates a group of switches for setting various inputs.

Figure 6:
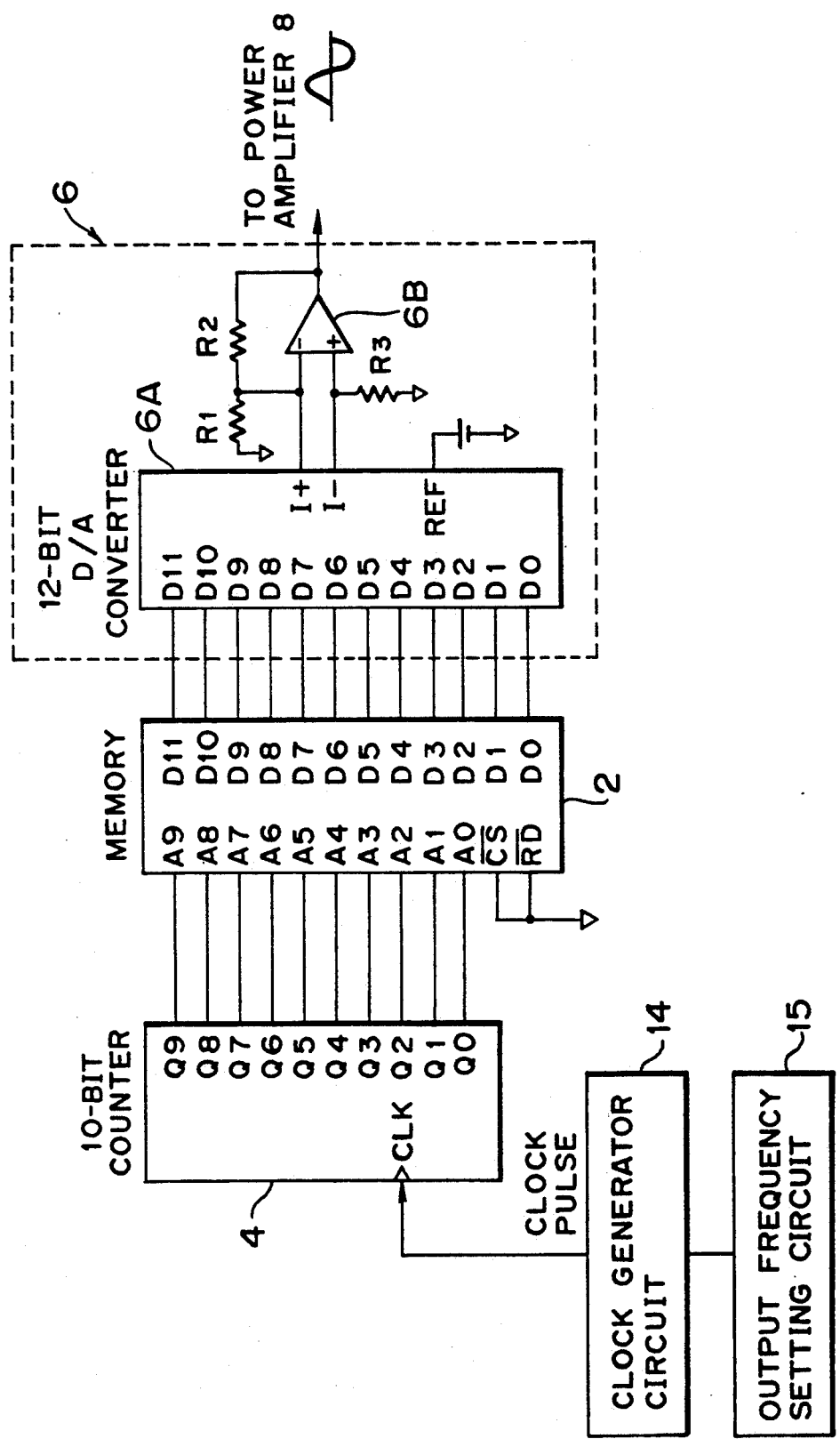
FIG. 6 is a detailed block diagram of a counter 4, a waveform memory 2, and a D/A converter 6 shown in FIG. 5.

FIG. 6 indicates a detailed circuit structure of the counter 4, the waveform memory 2, and a D/A converter 6 shown in FIG. 5. The present embodiment uses a 10-bit counter as the counter 4. Therefore, its count value repeats 0 to 1023. Furthermore, as already described, since the waveform memory 2 stores amplitude data of one period in the output voltage waveform, the 1024 amplitude data read from the waveform memory 2 form one period of the output waveform.

Thus, independent of the output frequency, one period of output waveform is always formed by the 1024 amplitude data. In other words, the frequency of the clock pulse train outputted from the clock generator circuit 14 is always 1024 times the output frequency.

The input bit number of the waveform memory 2 is equal to the output bit number of the counter 4, which is 10 bits. In the present embodiment, the output bit number of the waveform memory 2 is 12 bits. Therefore, each of a series of data takes one of the values of 0 to 4095 (decimal), and is repeatedly read from the waveform memory 2 every period.

The D/A converter 6, as shown in FIG. 6, comprises a 12-bit D/A converter chip 6A, a calculation amplifier 6B, and resistors $R_1$ to $R_3$. Therefore, an analog signal of 1 cycle is obtained from the calculation amplifier 6B every time the counter 4 scans the addresses from 0 to 1023.

Figure 7:
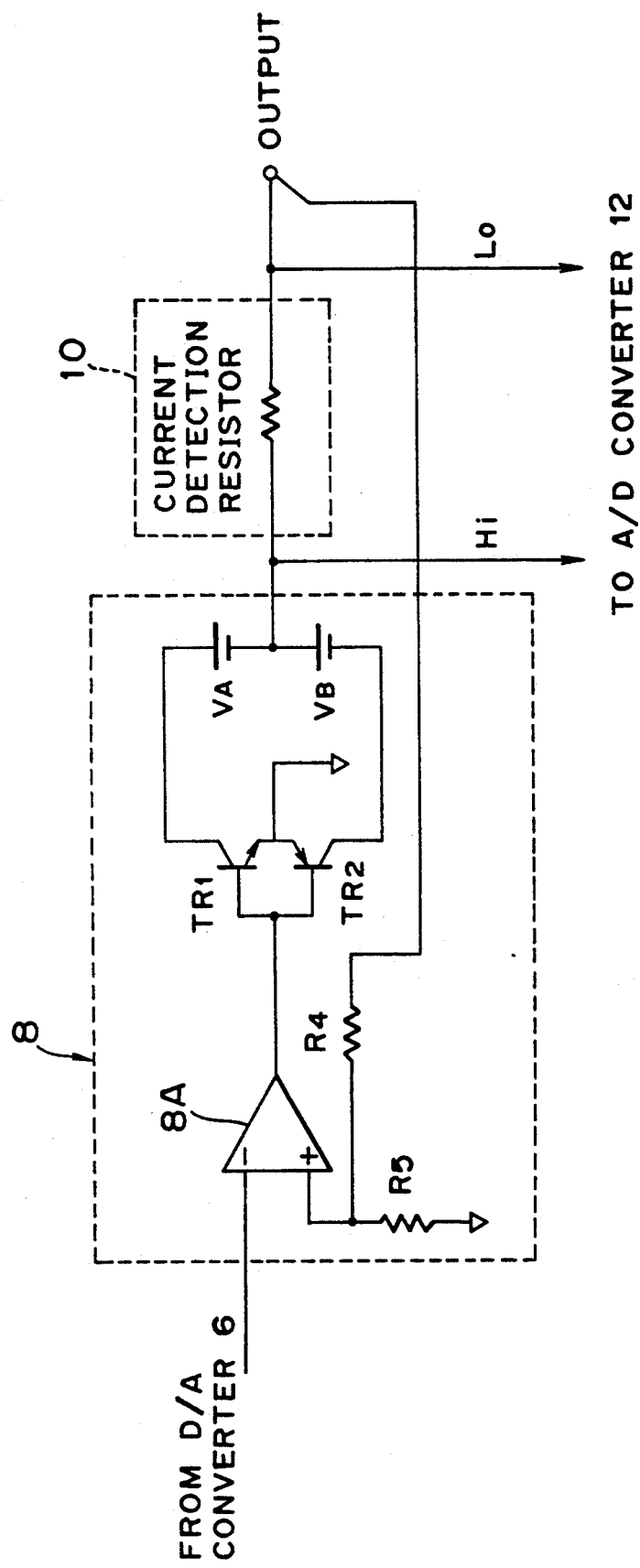
FIG. 7 is a circuit diagram of a power amplifier 8 and a current detection circuit 10 shown in FIG. 5.

FIG. 7 shows detailed circuit structures of the power amplifier 8 and the current detection circuit 10 shown in FIG. 5. Since a push-pull amplifier and a current detection resistor shown in this figure are known, description thereof is omitted.

Figure 8A:
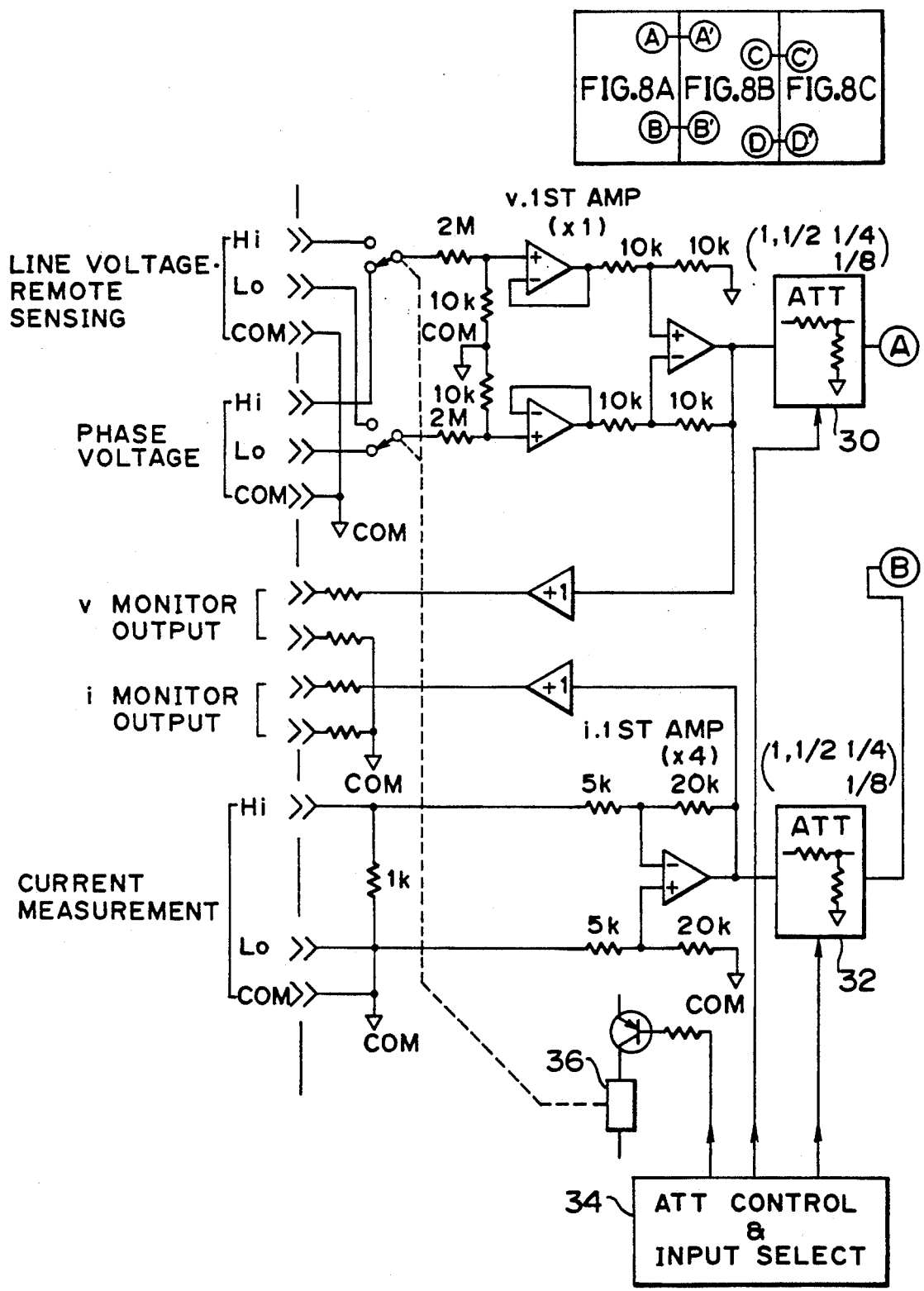
FIGS. 8A-8C are block diagrams showing an A/D converter 12 and its peripheral circuits shown in FIG. 5.
Figure 8B:
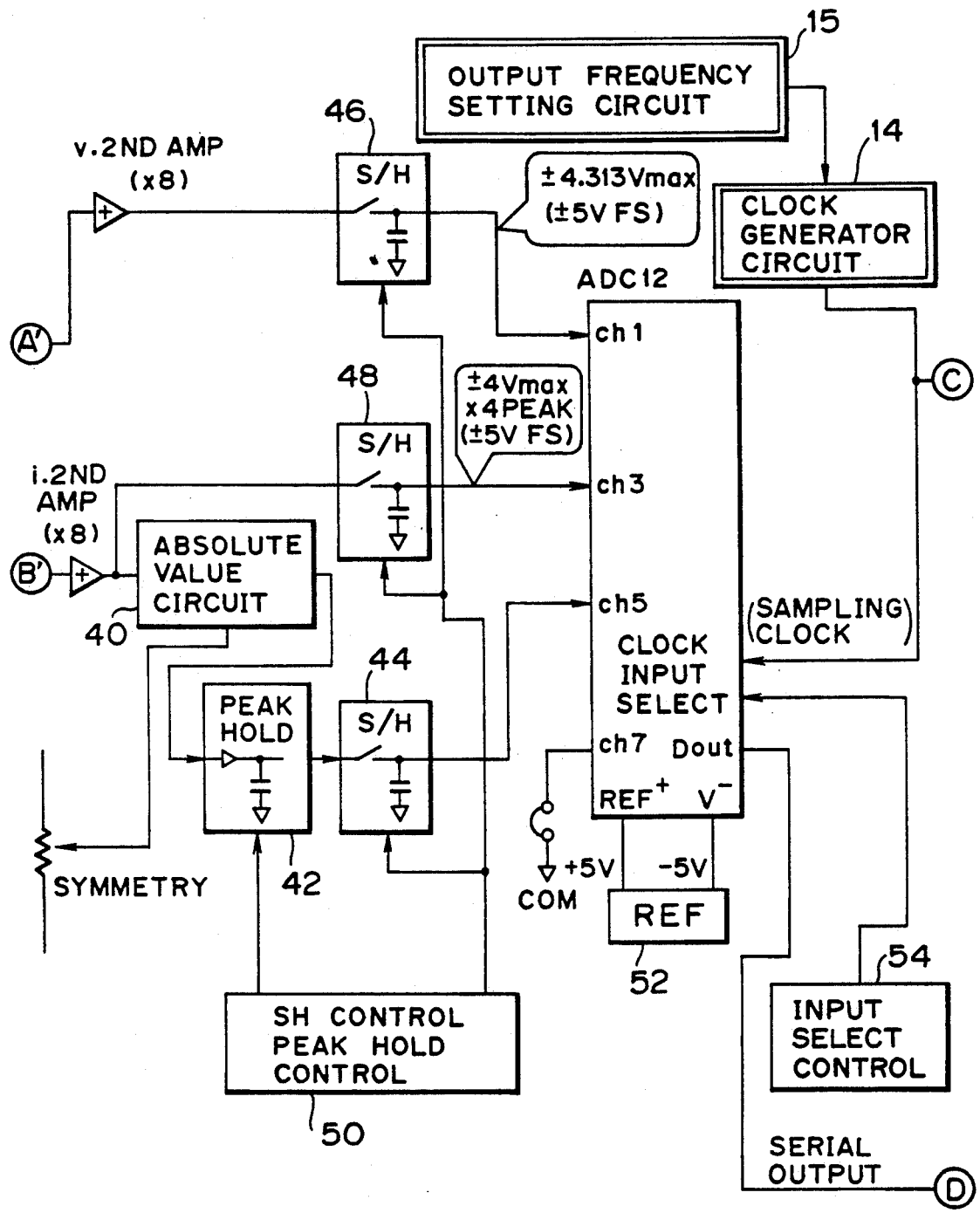
Figure 8C:
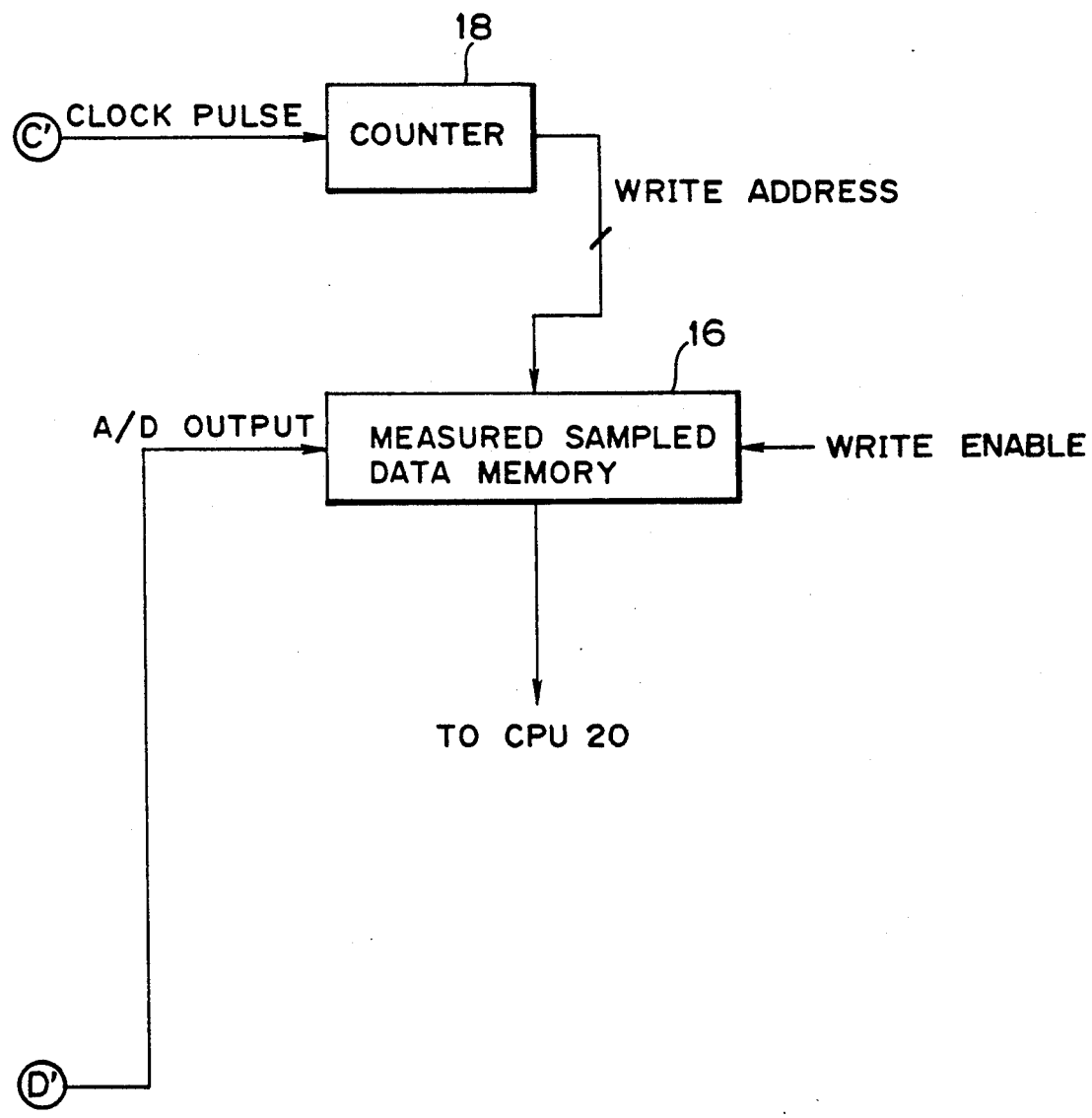

FIGS. 8A-8C show in detail the A/D converter 12 and its peripheral circuit shown in FIG. 5.

The circuit shown in FIGS. 8A-8C has an input terminal not only for digitalization of the load current but also for measuring a line-to-line voltage in view of a case where a triangular wave is generated by the present AC power supply apparatus. Furthermore, since it has an input terminal for measuring a phase voltage, it is possible to calculate a power consumption in the load by measuring the load current.

Furthermore, in the circuit shown in FIGS. 8A-8C, a peak detector, which always detected the analog peak value of the load current, is formed by an absolute value circuit 40 and a peak hold circuit 42. That is, the peak detector is provided so that the peak value can be detected even when a sharp change in a current occurs. This is because if a peak current is generated midway between adjacent sampling points, the A/D converter 12 is not able to detect the current peak value.

The A/D converter 12 achieves A/D conversion of these various inputs, so it is structured to receive an input select control signal from an input select control circuit 34.

Phase voltage input terminals Hi and Lo shown in FIG. 8A are connected to the output terminal of the AC power supply apparatus of the present embodiment. When the output voltage of the AC power supply apparatus is measured, the terminals are connected to these input terminals by the function of a relay 36.

A line voltage/remote sensing input terminals Hi and Lo are provided for measuring not only a 3-phase AC line-to-line voltage but also an actually applied voltage (remote sensing voltage) across load terminals. That is, when three units of the AC power supply apparatus of the present invention are used, and their outputs are star-connected to be used as a three-phase power supply, the line voltages can be measured by connecting these input terminals between the three-phase lines. Furthermore, when a voltage drop is large in a line connecting the AC power supply apparatus and the an AC load, the actual voltage applied to the AC load is unknown. Then, to measure the applied voltage of the AC load directly from both input terminals, a voltage detection cable is connected to the line voltage/remote sensing input terminals.

Current measuring input terminals Hi and Lo are connected across a current detection resistor provided at the output side of the AC power supply apparatus, and used for measuring the output current.

When the above various voltages and the current are measured, differential amplifiers are provided after the individual input ends to prevent increases in errors due to a common mode noise.

Furthermore, to expand the measurement ranges of voltage and current signals, a voltage attenuator 30 and a current attenuator 32 variable in 4 steps are provided, and amplifiers (2nd AMP) are connected after these attenuators to adjust the voltage level to be measured to the input voltage range of the A/D converter 12.

The A/D converter 12 incorporates an 8-channel multiplexer. Its first input end ch1 is applied with a voltage measurement signal through a sample hold circuit 46, and its third input end ch3 is applied with a current measurement signal through a sample hold circuit 48.

To measure the peak value of a current, the current measurement signal is inputted to the peak hold circuit 42 through the absolute value circuit 40, the detected peak signal is passed through a sample hold circuit 44, and inputted to a fifth input end ch5 of the A/D converter 12.

Thus, in the present embodiment, since the clock pulses train for forming the output voltage (power supply output) is commonly used as sampling clock pulses when obtaining sampled data required for the FFT. Thus, data of exactly one period can always be sampled, thereby eliminating the need for the window processing.

EMBODIMENT 2

Figure 9:
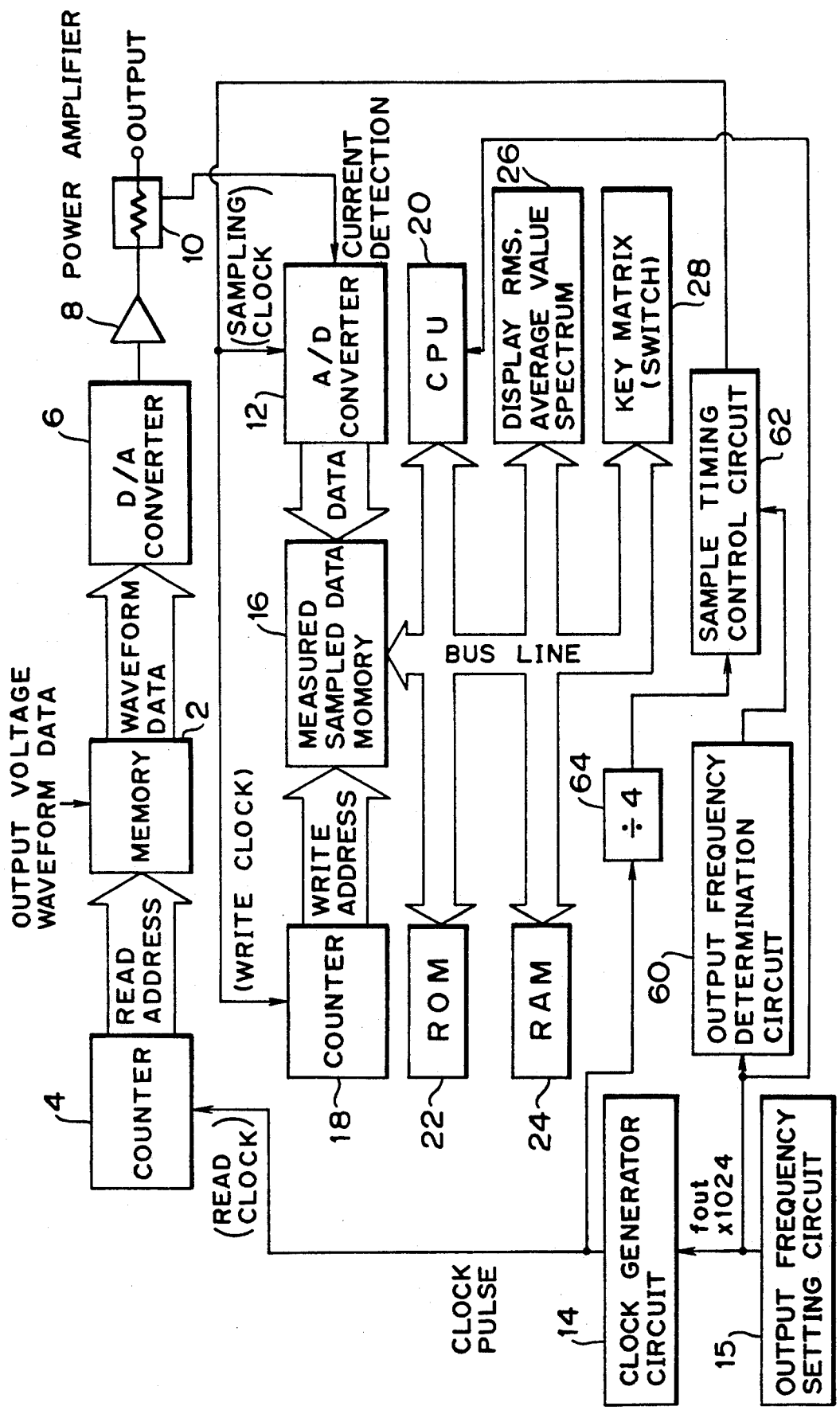
FIG. 9 is a block diagram showing a second embodiment of an AC power supply apparatus in accordance with the present invention.

FIG. 9 shows a second embodiment of the present invention. This embodiment differs from the first embodiment shown in FIG. 5 in that it varies modes of sampling the detected load current in accordance with an output frequency $f_{out}$.

To achieve this the second embodiment shown in FIG. 9 has an output frequency determination circuit 60 which determines the sampling mode in accordance with the following ranges of the output frequency:

$$1\text{Hz} \leq f_{out} < 16\text{Hz} \qquad (i)$$

$$16\text{Hz} \leq f_{out} < 256\text{Hz} \qquad (ii)$$

$$256\text{Hz} \leq f_{out} < 4096\text{Hz}. \qquad (iii)$$

Then, information of the range to which the output frequency $f_{out}$ belongs is applied to a sample timing control circuit 62. The function of the sample timing control circuit 62 will be described later with reference to FIGS. 10-12.

In the present embodiment, in sampling a waveform inputted to the A/D converter 12, an analog waveform of one period is measured in terms of 256 data. However, it is the same as the first embodiment that one period of output waveform is formed by the 1024 amplitude data which are read from the waveform memory 2. Therefore, in the present embodiment, a frequency divider 64 is provided which divides the clock pulse train frequency by a factor of 4.

Figure 10:
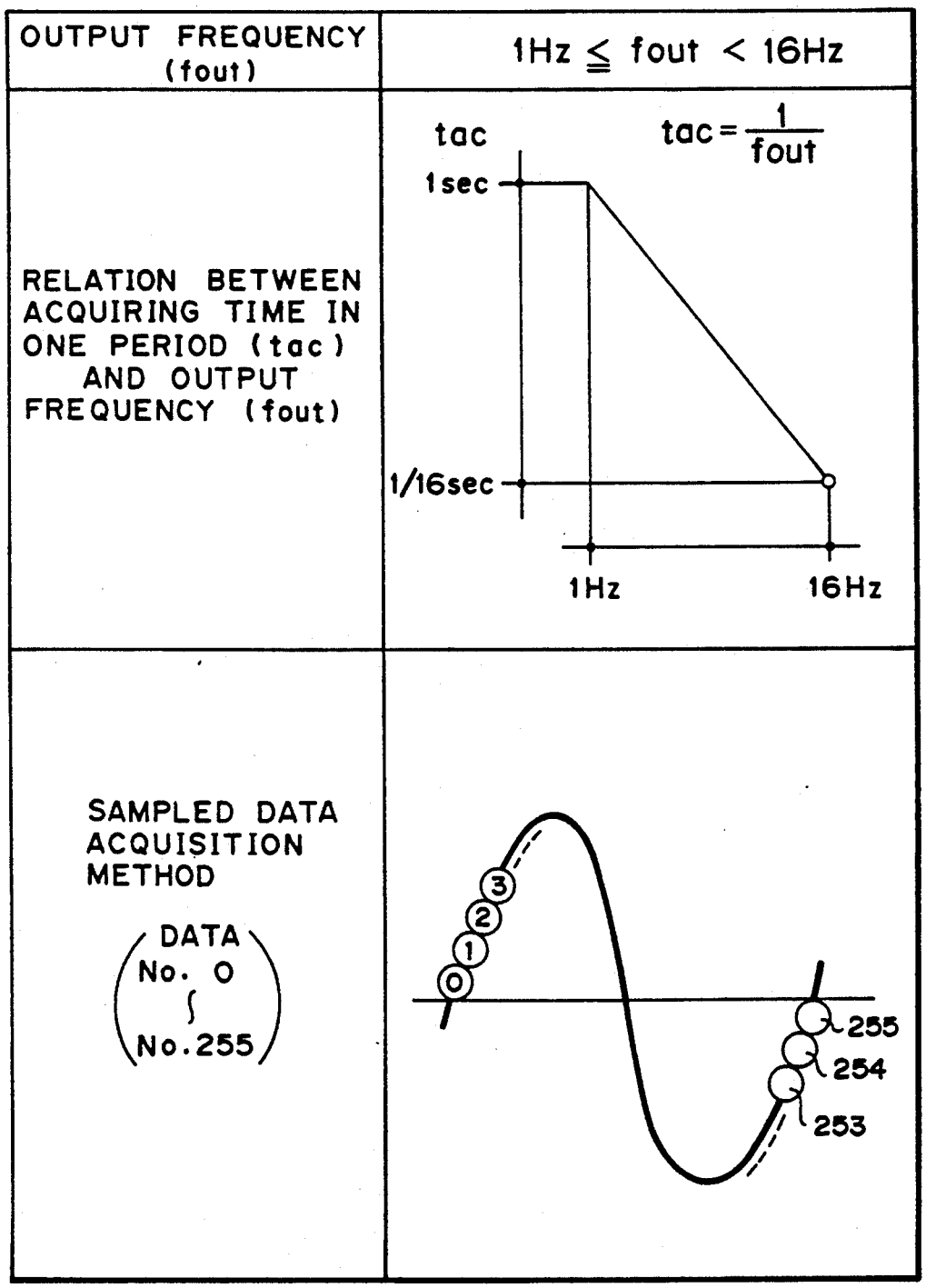
FIG. 10 is a diagram illustrating a relationship between acquiring time in one period and output frequency, and a waveform for explaining a sampling method in the second embodiment.
Figure 11:
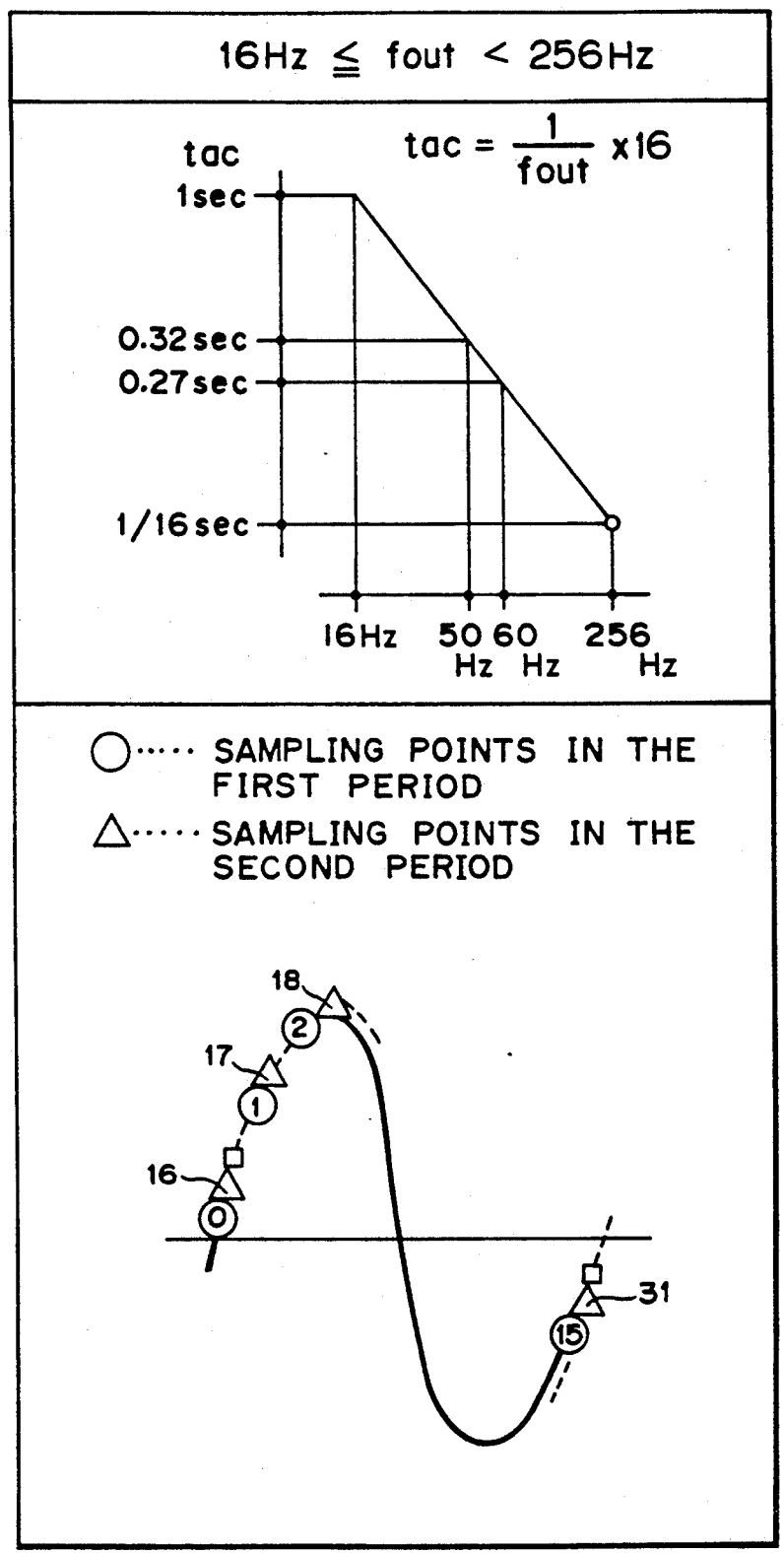
FIGS. 11 and 12 are diagrams illustrating a relationship between acquiring time in one period and output frequency, and a waveform for explaining a sampling method in the second embodiment.
Figure 12:
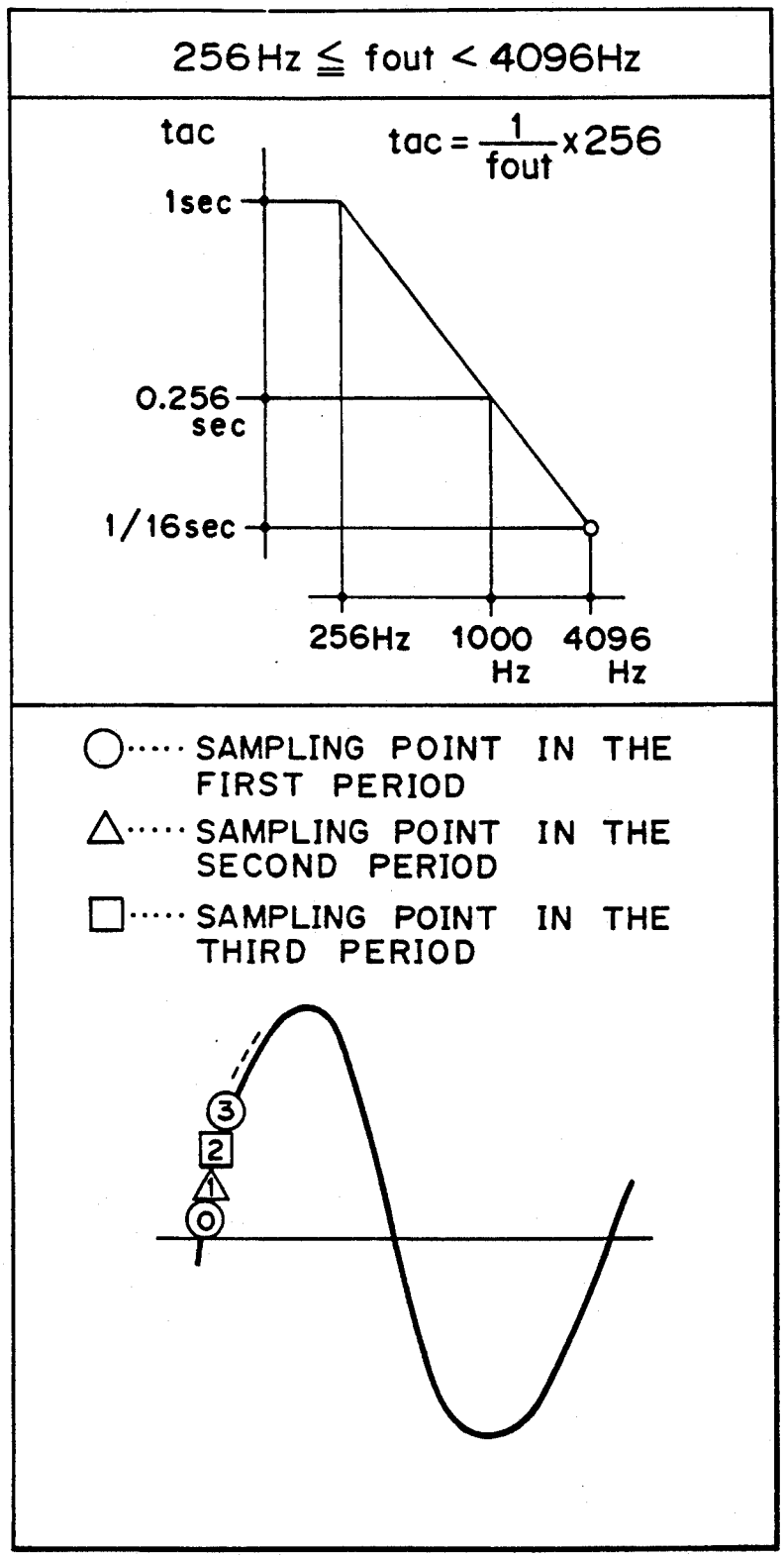

FIGS. 10-12 show that three types of data sampling are carried out according to the output frequency $f_{out}$ of the AC power supply apparatus.

$$For\ 1\ Hz < f_{out} < 16\ Hz \qquad (i)$$

As shown in FIG. 10, amplitudes in one period are continuously sampled, and the 256 sampled data are supplied to the data memory 16.

$$16\ Hz = f_{out} < 256\ Hz \qquad (ii)$$

As shown in FIG. 11, first 16 points in a first period are sampled, and second 16 points in a second period are sampled, etc., while shifting sampling phases by a predetermined phase shift increment $\alpha$ ($\alpha = 2\pi/256$). Thus, samplings are made over the remaining 14 periods while shifting sampling phases by the phase shift increment $\alpha$ for each period. A phase shift amount $M\alpha$ increases in proportion to the sequential number M of waveforms, where M=1, 2, ..., 16. Thus, sampled data at 256 different sampling points corresponding to one period are obtained from 16 periods.

$$256\ Hz < f_{out} < 4096\ Hz \qquad (iii)$$

As shown in FIG. 12, first one point in a first period is sampled, second one point in a second period is sampled, etc., while shifting a sampling phase by the phase shift increment $\alpha$, and then sampling are made over the remaining 254 periods while shifting the sampling phase by the phase shift increment $\alpha$ for each period. A phase shift amount $M\alpha$ increases in proportion to the sequential number M of waveforms, where M=1, 2, ..., 256. Thus, sampled data at 256 different sampling points corresponding to one period are obtained from 256 periods.

In the present embodiment, the number of sampling points sampled in one period is varied according to the ranges of the output frequency $f_{out}$, but the phase shift increment $\alpha$ is independent of the output frequency $f_{out}$.

As described above, in the second embodiment, since the read clock of the waveform memory 2 and the sampling clock of the A/D converter 12 are necessarily related with each other, data associated with one period can be always exactly sampled, thereby eliminating the need for the window processing.

FIG. 13B is a flow chart which represents the features of the above-described first and second embodiments more clearly. As can be seen from this figure, in the first and second embodiments, it is needless to carry out the window processing (step S4 in FIG. 13A) prior to the FFT processing (step S6).

Figure 14A:
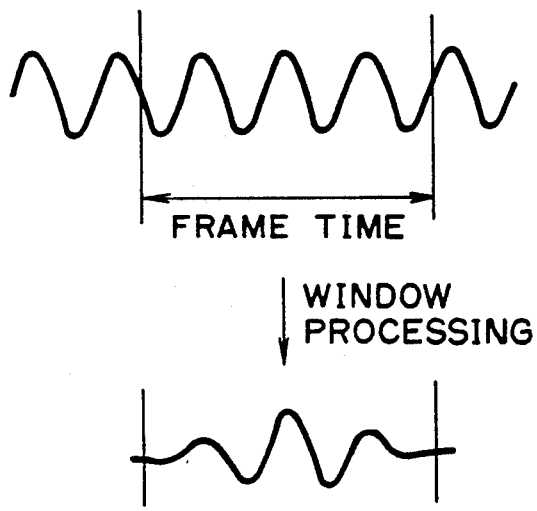
FIGS. 14A and 14B are diagrams illustrating relationships between a waveform of the first and second embodiments and waveforms of the prior art.
Figure 14B:

That is, in the first and second embodiments, as shown in FIG. 14B, since exactly one period is always sampled, the window processing is not required.

EMBODIMENT 3

The above-described two embodiments are described assuming that the portion for generating the AC power and the portion for carrying out the FFT processing are contained in the same case, however, alternatively, it is also possible that the portion for the FFT processing is incorporated in a separate case to monitor at a physically separate position.

That is, in the block diagram shown in FIG. 5, the counter 18, the data memory 16, the A/D converter 12, the CPU 20, the ROM 22, the RAM 24, the display 26, and the input switch 28 are incorporated in a separate case, and a clock supplied from the clock generator circuit 14 is inputted to the counter 18 through a cable (not shown). Furthermore, the current detection signal obtained from the current detection circuit 10 is also inputted to the A/D converter 12 through a different cable. In this case, it is also possible to transmit the current detection signal through an optical cable to remove effects due to ambient noises.

Furthermore, it is also possible to use a different synthesizer as the clock generator circuit 14, and the synthesizer sets the output frequency according to manual/remote operation.

EMBODIMENT 4

The above-described embodiment 1 uses the pulses outputted from the clock generator circuit 14, as is, as the sampling pulses of the A/D converter 12. However, alternatively, it is also possible to form the sampling pulses according to the output of the address counter 4 or the address counter 18.

The present invention has been described in detail with respect to preferred embodiments, and it will now be that changes and modifications may be made without departing from the invention in its broader aspects, and it is the intention, therefore, in the appended claims to cover all such changes and modifications as fall within the true spirit of the invention.

What is claimed is:
1. An AC power supply apparatus comprising:
   clock generator means for generating a clock pulse train;
   a first address counter receiving the clock pulse train for generating read addresses;
   a waveform memory previously stored with amplitude data of one period of a predetermined voltage waveform;
   a D/A converter for converting the memory data which is read from said waveform memory to an analog signal in response to the read addresses outputted from said first address counter;
   a power amplifier for amplifying the output of said D/A converter to supply a load with an AC voltage;
   current detection means for converting the current flowing through said load to an analog voltage;
   an A/D converter for outputting current data by sampling the output of said current detection means using the clock pulse train or a signal associated with the clock pulse train as sample clock pulses;
   a second address counter for converting the clock pulse train or the signal associated with the clock pulse train to write addresses;
   a sampled data memory for storing said current data in response to the write addresses;
   FFT processing means for performing the Fourier transformation on the current flowing through said load using data stored in said sampled data memory; and
   display means for displaying the output of said FFT processing means.

2. The AC power supply apparatus as claimed in claim 1, wherein the frequency $F_{CLK}$ of the clock pulse train is always set at N times the frequency $f_L$ of the AC voltage applied to said load ($F_{CLK}=N \cdot f_L$), where N is a predetermined positive integer greater than two.

3. The AC power supply apparatus as claimed in claim 1, wherein said A/D converter continuously samples one period of the analog voltage outputted from said current detection means to obtain K sampled data, where K is a predetermined positive integer.

4. The AC power supply apparatus as claimed in claim 1, wherein said A/D converter samples a predetermined number of current data in each one of a plurality of successive periods of the analog voltage outputted from said current detection means, while successively shifting sampling points in each of the periods by a predetermined phase shift increment to obtain K current data, where K is a predetermined positive integer.

5. The AC power supply apparatus as claimed in claim 4, wherein the number of the current data is varied according to the frequency of the AC voltage applied to said load.

6. The AC power supply apparatus as claimed in claim 1, wherein said A/D converter samples one current data in each one of a plurality of successive periods of the analog voltage outputted from said current detection means, while successively shifting a sampling point in each of the periods by a predetermined phase shift increment to obtain K current data, where K is a predetermined positive integer.

7. The AC power supply apparatus as claimed in claim 1, wherein said signal generated associated with the clock pulse train is the output signal of said first or second address counter.

8. A load current measurement method in an AC power supply apparatus including clock generator means for generating a clock pulse train, an address counter receiving the clock pulse train for generating a read addresses, a waveform memory previously stored with amplitude data of one period of a predetermined voltage waveform, a D/A converter for converting the memory data which is read from said waveform memory to an analog signal in response to the read addresses outputted from said address counter, and a power amplifier for amplifying the output of said D/A converter to supply a load with an AC voltage, said method comprising the steps of:

converting the current flowing through said load to an analog voltage;

outputting current data by sampling the analog voltage using the clock pulse train or a signal associated with the clock pulse train as sample clock pulses;

storing the current data according to the clock pulse train or the signal associated with the clock pulse train;

performing the Fourier transformation on the current flowing through said load using to the current data; and displaying the result of the Fourier transformation.

* * * * *

UNITED STATES PATENT AND TRADEMARK OFFICE
CERTIFICATE OF CORRECTION

PATENT NO. : 5,305,242
DATED : April 19, 1994
INVENTOR(S) : Noriyoshi KIKUCHI et al.

It is certified that error appears in the above-indentified patent and that said Letters Patent is hereby corrected as shown below:

Claim 8, Column 10, Lines 8 and 9: "generating a read addresses" should read --generating read addresses--

Signed and Sealed this

Thirty-first Day of January, 1995

Attest:

BRUCE LEHMAN

Attesting Officer        Commissioner of Patents and Trademarks